US008399291B2

(12) United States Patent  
Brusso et al.

(10) Patent No.: US 8,399,291 B2  
(45) Date of Patent: Mar. 19, 2013

(54) UNDERFILL DEVICE AND METHOD

(75) Inventors: Patricia A Brusso, Chandler, AZ (US); Mitul B Modi, Phoenix, AZ (US); Carolyn R. McCormick, Hillsboro, OR (US); Ruben Cadena, Tempe, AZ (US); Sankara J Subramanian, Chandler, AZ (US); Edward L. Martin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1234 days.

(21) Appl. No.: 11/169,518

(22) Filed: Jun. 29, 2005

(65) Prior Publication Data

US 2007/0004085 A1 Jan. 4, 2007

(51) Int. Cl.  
*H01L 21/00* (2006.01)

(52) U.S. Cl. ........ 438/106; 438/107; 438/108; 438/109; 438/123

(58) Field of Classification Search .................... 438/106  
See application file for complete search history.

(56) References Cited

U.S. PATENT DOCUMENTS

| | | | | |
|---|---|---|---|---|
| 4,581,680 A * | 4/1986 | Garner | ........................ | 361/768 |
| 5,086,558 A * | 2/1992 | Grube et al. | ................... | 29/832 |
| 5,352,926 A * | 10/1994 | Andrews | ........................ | 257/717 |
| 6,050,832 A * | 4/2000 | Lee et al. | ........................ | 439/91 |
| 6,258,627 B1 * | 7/2001 | Benenati et al. | ............... | 438/108 |
| 6,319,829 B1 * | 11/2001 | Pasco et al. | ........................ | 438/678 |
| 6,433,565 B1 * | 8/2002 | Desai et al. | ................... | 324/756.02 |
| 6,670,699 B2 * | 12/2003 | Mikubo et al. | ................ | 257/678 |
| 6,783,828 B2 * | 8/2004 | Fujimaru et al. | ............. | 428/40.1 |
| 6,933,617 B2 * | 8/2005 | Pierce | ........................ | 257/786 |
| 2003/0094666 A1 * | 5/2003 | Clayton et al. | ................ | 257/459 |
| 2003/0127737 A1 * | 7/2003 | Takahashi | ..................... | 257/738 |
| 2003/0230799 A1 * | 12/2003 | Yee et al. | ........................ | 257/706 |
| 2005/0023033 A1 * | 2/2005 | Saiki et al. | ..................... | 174/260 |
| 2005/0221534 A1 * | 10/2005 | Suh et al. | ........................ | 438/109 |
| 2006/0022328 A1 * | 2/2006 | Lee | ........................ | 257/698 |
| 2006/0038303 A1 * | 2/2006 | Sterrett et al. | ................ | 257/779 |
| 2006/0220175 A1 * | 10/2006 | Guzek et al. | ................... | 257/532 |
| 2006/0223226 A1 * | 10/2006 | Guzek et al. | ................... | 438/106 |
| 2006/0226538 A1 * | 10/2006 | Kawata | ........................ | 257/701 |
| 2007/0090506 A1 * | 4/2007 | Sundstrom | .................... | 257/686 |

* cited by examiner

*Primary Examiner* — N Drew Richards  
*Assistant Examiner* — Ankush Singal  
(74) *Attorney, Agent, or Firm* — Schwegman, Lundberg & Woessner, P.A.

(57) ABSTRACT

An underfill device and method have been are provided. Advantages of devices and methods shown include dissipation of stresses at an interface between components such as a chip package and an adjacent circuit board. Another advantage includes faster manufacturing time and ease of manufacture using underfill devices and methods shown. An underfill assembly can be pre made with conductive structures included within the underfill assembly. Steps such as flowing epoxy and curing can be eliminated or performed concurrently with other manufacturing steps.

7 Claims, 4 Drawing Sheets

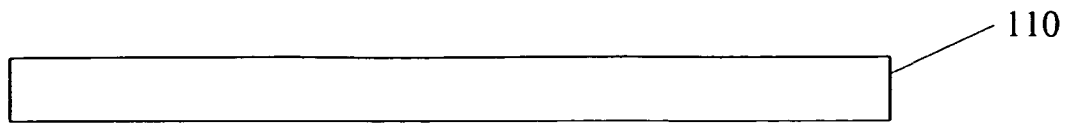
Fig. 1A
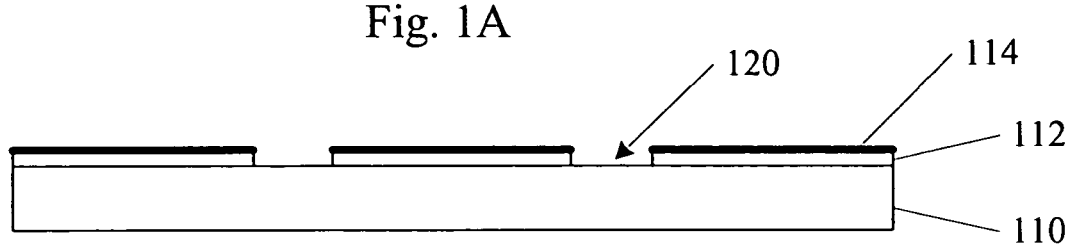
Fig. 1B
Fig. 1C
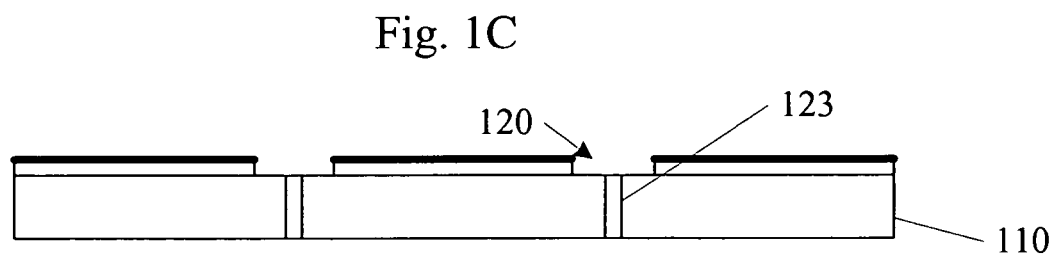
Fig. 1D
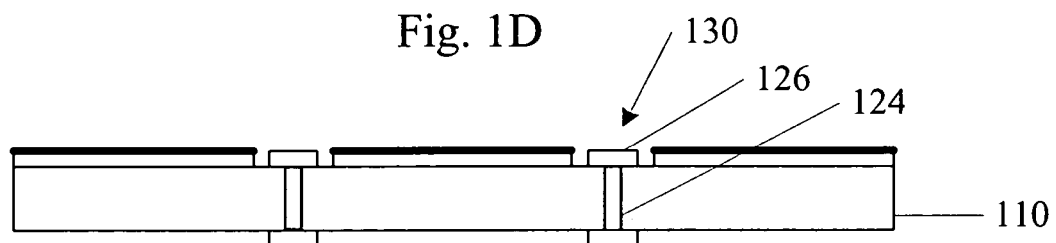
Fig. 1E
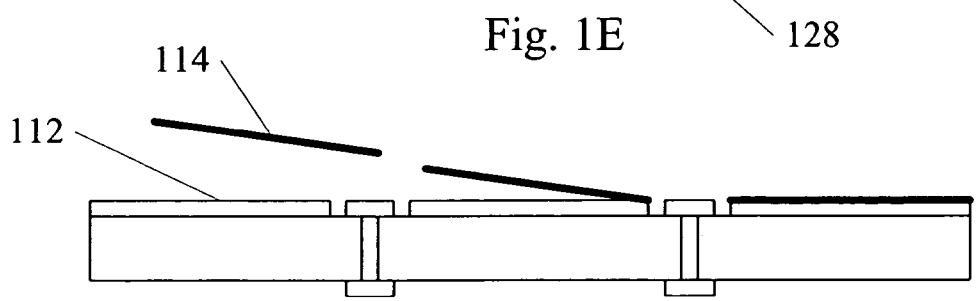
Fig. 1F

UNDERFILL DEVICE AND METHOD

TECHNICAL FIELD

Embodiments of the present invention relate generally to the field of circuit interconnection and, in particular, aspects of the present invention relate to chip package interconnection to adjacent circuit boards.

BACKGROUND

Semiconductor chips such as processor chips are housed in chip packages, which are subsequently attached to circuit boards in the manufacture of a number of electronic devices. These devices, include personal computers, handheld computers, mobile telephones, MP3 players and other numerous information processing devices. One common configuration of input/output connections between chips, substrates, packages, and adjacent circuit boards, etc. includes grid array connection structures. In one common grid array connection structure, solder balls such as in ball grid array packages are used to connect between grids.

There are a number of design concerns that are taken into account when forming grid arrays. High mechanical strength and reliability of the grid array connections are desirable. In a solder structure grid interconnection example, two connection surfaces with one or more solder balls in between are heated to reflow the solder and form an electrical connection. The heating process causes adjacent structures such as chips, substrates, chip packages and circuit boards to expand and contract at different rates due to differences in the coefficient of thermal expansion (CTE) in each component. The differences in CTE may cause unwanted stresses and strains in resulting products. In addition, further stress is induced by product use conditions such as powering up and down. These product use conditions impose cyclic thermal stresses on components as well.

BRIEF DESCRIPTION OF THE DRAWINGS

FIG. 1A shows an underfill device in process according to an embodiment of the invention.

FIG. 1B shows an underfill device in process according to an embodiment of the invention.

FIG. 1C shows an underfill device in process according to an embodiment of the invention.

FIG. 1D shows an underfill device in process according to an embodiment of the invention.

FIG. 1E shows an underfill device in process according to an embodiment of the invention.

FIG. 1F shows an underfill device in process according to an embodiment of the invention.

DETAILED DESCRIPTION

Figure 2:
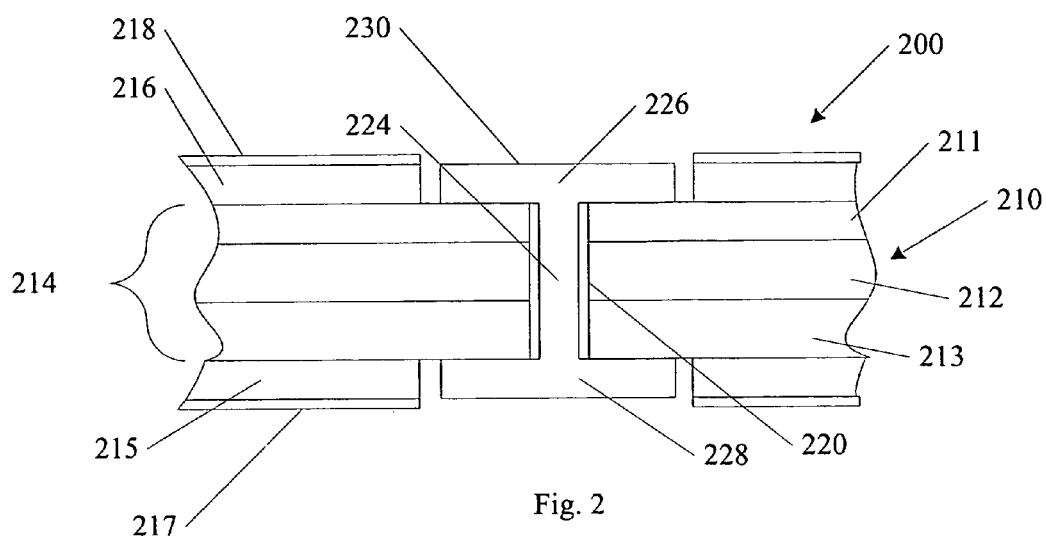
FIG. 2 shows a close up view of an electrical connection according to an embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, mechanical, electrical, chemical changes, materials choices, etc. may be made, without departing from the scope of the present invention. The following detailed description is, therefore, not to be taken in a limiting sense, and the scope of the invention should be determined with reference to the appended claims, along with the full scope of equivalents to which such claims are entitled.

One method of providing increased mechanical strength to an interconnecting region of an electronic assembly includes introduction of an epoxy underfill layer after solder balls have already been connected between two component surfaces. In one underfill process, liquid epoxy or other curable liquid is flowed into a gap between two component surfaces and around the reflowed solder connections using capillary forces to draw the liquid into the gap. The liquid epoxy is then cured to form a more robust connection between the two component surfaces and protect the solder connections from failures such as stress cracking. Such capillary flow methods can be used between chips and substrates, or between chip packages and adjacent circuit boards, between two circuit boards, etc. One drawback of using capillary flow methods includes increased manufacturing time to both introduce the epoxy, and cure the epoxy.

FIGS. 1A-1F shown one possible method of forming an underfill assembly according to an embodiment of the invention. FIG. 1A shows a compliant layer of material 110. In one embodiment, the compliant layer of material is a single material. In one embodiment, the compliant layer of material 110 is a composite layer made up of, for example multiple bonded layers, particles embedded in a matrix, a combination of both, etc. In one embodiment, the compliant layer of material 110 is an insulator material. In one embodiment, the compliant layer 110 includes a polymer layer. In one embodiment, the polymer layer includes a curable polymer, such as an epoxy layer. In one embodiment, the polymer layer includes a layer with heat activated properties, such as a melting temperature or glass transition temperature where application of temperature will cause a degree of adhesion to adjacent surfaces. In one curable polymer embodiment such as epoxy, application of heat facilitates completion of the curing process.

FIG. 1B shows the compliant layer 110 with an adhesive layer 112 placed over a portion of a top surface. Although a top surface is shown, other surfaces such as the bottom surface are also suitable for location of the adhesive layer 112. In one embodiment, a backing strip 114 is further included over the adhesive layer 112. As shown in FIG. 1B, in one embodiment, exposed portions 120 of the compliant layer 110 are included without any adhesive 112 or backing strip 114. As shown in FIG. 1C, in one embodiment, a number of through thickness holes 122 are included within the exposed portions 120.

In one embodiment, the adhesive can be activated through an external step such as heating a thermally activated adhesive, or applying force to a pressure sensitive adhesive. In one embodiment, the backing strip 114 includes a peel off backing to protect the adhesive 112 until assembly.

FIG. 1D shows application of an intermediate layer 123 within the holes 122. Although shown in FIG. 1C, other embodiments are provided in the present disclosure that do not include the intermediate layer 123. In one embodiment the intermediate layer 123 includes a metallic layer. In one embodiment, the intermediate layer 123 includes a copper layer deposited by vapor deposition, electroplating, or other suitable method. In one embodiment, only a thin layer inside the holes 122 is coated with the intermediate layer 123. In one embodiment, the intermediate layer 123 facilitated filling of the holes 122 as discussed below.

FIG. 1E shows a conductive through thickness plug 130. A through thickness portion 124 is shown with a top portion 126 and a bottom portion 128 having larger contact surface areas than the through thickness portion 124. In one embodiment, the through thickness plug 130 includes a solder plug. In one embodiment the through thickness portion 124, the a top portion 126 and the bottom portion 128 are substantially continuous. In one embodiment, the through thickness plug 130 includes continuous solder. In one embodiment, the through thickness plug 130 includes continuous conductive epoxy. One of ordinary skill in the art, having the benefit of the present disclosure will recognize that other conductive materials such as metals, conductive polymers, etc. are also within the scope of the invention.

As discussed above, in one embodiment, an intermediate layer 123 is included within the holes 122, although the invention is not so limited. An advantage of the intermediate layer 123 is that in selected embodiments, it provides compatibility between the compliant layer 110 material and the conductive through thickness plug 130 material. For example, in one embodiment, the intermediate layer 123 includes copper, within a polymer compliant layer 110. A through thickness plug 130 of solder can be more easily applied into the holes 122 due to the presence of copper as an intermediate layer 123. In one embodiment, liquid solder is drawn into the holes 122 due to interfacial energy driving forces between copper and solder. In other embodiments, using for example a conductive epoxy to form the through thickness plug 130, an intermediate layer 123 may not be necessary.

In one embodiment, the top portion 126 and the bottom portion 128 are flared out to a larger surface area as discussed above. An advantage of this configuration includes easier subsequent attachment to device conductive structures such as metal input/output pads, solder bumps, etc.

FIG. 1F shows removal of the backing strip 114 from the adhesive layer 112. In one embodiment, the backing strip 114 includes a peel off strip as illustrated in FIG. 1F. Other protective packaging in place of the backing strip 114 is also within the scope of embodiments of the invention. As will be discussed below, in one embodiment, after removing the backing strip 114, the adhesive layer 112 is used to adhere to an adjacent component such as a chip package during assembly. Although the adhesive layer 112 and backing strip 114 are shown on only one side of the compliant layer 110, the invention is not so limited. In one embodiment, both a top side and a bottom side of the compliant layer 110 include an adhesive layer. In one embodiment, both a top side and a bottom side adhesive layer include a backing strip.

FIG. 2 shows a close up view of a through thickness plug 230 similar to embodiments described above. The through thickness plug 230 provides an electrical connection pathway through a compliant layer 210. Similar to embodiments described above, in one embodiment, a first adhesive layer 216 is included on a surface of the compliant layer 210. In one embodiment, a first backing strip 218 is included on a surface of the first adhesive layer 216. In one embodiment, a second adhesive layer 215 is included on an opposing surface of the compliant layer 210. In one embodiment, a second backing strip 217 is included on a surface of the second adhesive layer 215. FIG. 2 shows a cross section of one embodiment including an intermediate layer 220. As shown in the Figure, in one embodiment, only an interior surface of the hole is coated with the intermediate layer 220.

As shown in FIG. 2, in one embodiment, the through thickness plug 230 is continuous. A through thickness portion 224 is shown with a top portion 226 and a bottom portion 228. The top portion 226 and the bottom portion 228 are shown as substantially rectangular for illustration purposes. In one embodiment, the top portion 226 and the bottom portion 228 are formed by flowing excess solder or other conductive material into the hole in the compliant layer 210. In one embodiment solder or other conductive material is electroplated, or screen printed, etc. into the hole in the compliant layer 210. In flowing embodiments, surface tension will be a driving force in forming geometry of the top portion 226 and the bottom portion 228. In one embodiment the top portion 226 and the bottom portion 228 include dome shaped geometries.

In one embodiment, the compliant layer 210 includes gradiated physical properties. A thickness 214 of the compliant layer is shown in FIG. 2. In one gradiated example, a top portion of the compliant layer 210 possesses a physical property that is different from a bottom portion of the compliant layer 210, or other portions of the compliant layer 210. Examples of physical properties include modulus, coefficient of thermal expansion, etc. To achieve a gradiated compliant layer, in one embodiment two or more layers are combined where layers possess different physical properties. FIG. 2 shows a first layer 211 and a second layer 212 and a third layer 213 that together form the compliant layer 210. In one embodiment the first layer includes a first coefficient of thermal expansion, and the third layer includes a coefficient of thermal expansion that is different from the first coefficient of thermal expansion. In one embodiment, a coefficient of thermal expansion in the compliant is tailored to match a die on one interface, and a circuit board on an adjacent interface. Layers such as first, second and third layers 211, 212, 213 are used in one embodiment to gradually transition between different coefficients of thermal expansion, such as between a die and a circuit board. In one embodiment, a gradually changing coefficient of thermal expansion is chosen for successive layers such as the first, second and third layers 211, 212, 213.

Although multiple layers are shown in FIG. 2 to describe a compliant layer with gradiated properties, the invention is not so limited. Other techniques such as manipulation of a single material microstructure can also be used to vary physical properties along a thickness of the compliant layer 210.

Figure 3:
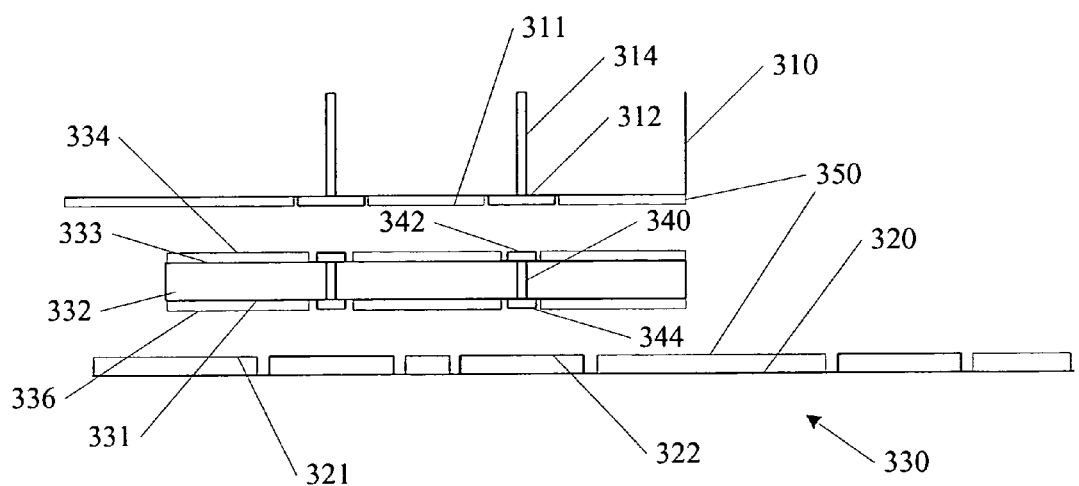
FIG. 3 shows an assembly operation using an underfill device according to an embodiment of the invention.

FIG. 3 shows an underfill assembly 330 similar to embodiments described above. A first component 310 such as a chip package is shown, and a second component 320 such as an adjacent circuit board is shown. The chip package 310 includes electrical connection surfaces 312 that are in turn coupled to circuitry inside the chip package 310 by additional pathways 314. Likewise, the circuit board 320 includes electrical connection surfaces 322.

In one method of assembly, a first adhesive 334 is placed in contact with a component surface 311. In one embodiment, a second adhesive 336 is placed in contact with a circuit board surface such as surface 321. In one embodiment, the component surfaces such as surface 311 and 321 include additional structures such as solder masks 350.

One advantage of adhesive layer 334 includes a stress distributing bond at the interface between a compliant layer 332 and the chip package surface 311. Another advantage of using an adhesive layer includes ease of assembly. Use of an adhesive layer such as layer 336 at other interfaces provides similar advantages in selected embodiments. In one embodiment the compliant layer 332 includes a layer with gradiated physical properties similar to embodiments described above.

In one embodiment, a physical property adjacent to a first surface 331 of the compliant layer 332 is matched to a physical property of an adjacent component surface 321. Likewise, in one embodiment, a physical property adjacent to a second surface 333 of the compliant layer 332 is matched to a physical property of an adjacent component surface 311. In one embodiment, a coefficient of thermal expansion is substantially matched between the first surface 331 and the component surface 321 and between the second surface 333 and the component surface 311. An advantage of a gradiated compliant layer 332 and matching physical properties includes accommodating damaging strains in assemblies such as FIG. 3 due to coefficient of thermal expansion, or other external stresses.

In one embodiment, after assembly as shown in FIG. 3, the underfill assembly 330 is adhered to at least one surface of an adjacent component. In one embodiment the compliant layer 332 is flowed, or otherwise activated such as by heating. In one embodiment, adhesive layers such as 334 are further activated such as by heating to form a bond at the interface between the underfill assembly 330 and adjacent components. In one embodiment an electrical connection such as solder is also reflowed.

Figure 4:
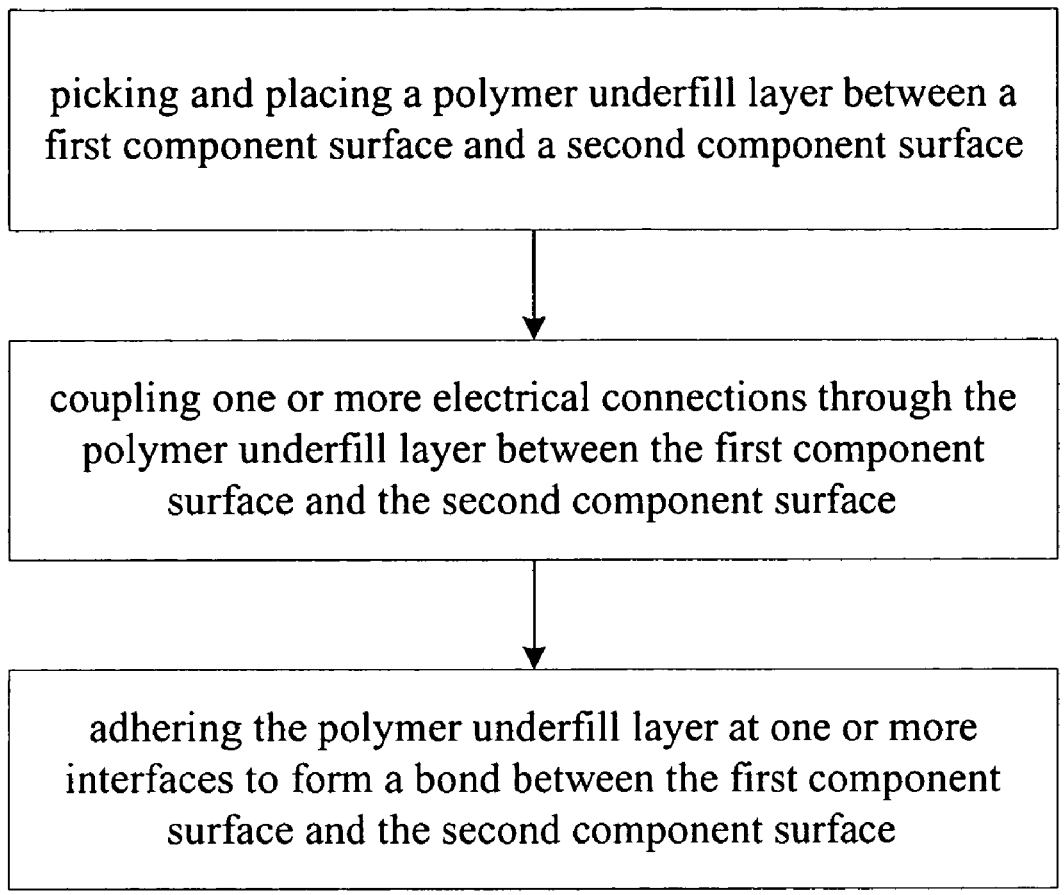
FIG. 4 shows a flow diagram of a method according to an embodiment of the invention.

FIG. 4 further illustrates a method of assembly according to an embodiment of the invention. In one embodiment, an underfill assembly as described in selected embodiments above is placed between a first component surface and a second component surface such as between a chip package and a circuit board. As shown in FIG. 4, electrical connections are made between the components such as a chip package and circuit board. In one embodiment coupling includes reflowing solder to form electrical connections. In one embodiment, coupling includes contacting and curing conductive epoxy or another carrier including conductive particles for example. FIG. 4 further shows adhering a polymer underfill layer to one or more interfaces. In one embodiment a bond is formed both between an underfill layer and a chip package, and between the underfill layer and a circuit board. In one embodiment, bonding of the underfill assembly is performed concurrently with forming electrical connections. For example heating the assembly to both reflow solder and flow or cure a polymer compliant underfill layer. Although one method is shown, the invention is not so limited. Variations is steps and more or fewer steps may be used in other methods according to embodiments of the invention.

Figure 5:
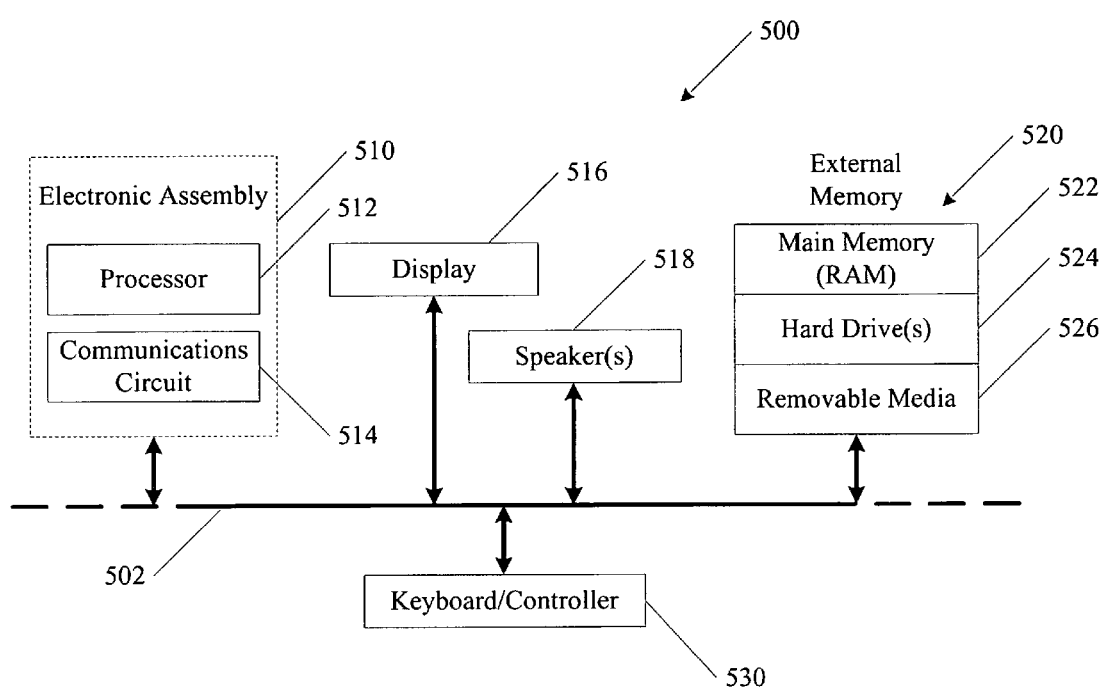
FIG. 5 shows an electronic device according to an embodiment of the invention.

An example of an electronic device using semiconductor chips and underfill layers is included to show an example of a higher level device application for the present invention. FIG. 5 is a block diagram of an electronic device 500 incorporating at least one electronic assembly 510 utilizing an underfill assembly and method in accordance with at least one embodiment of the invention. Electronic device 500 is merely one example of an electronic system in which embodiments of the present invention can be used. Examples of electronic devices 500 include, but are not limited to personal computers, mobile telephones, personal data assistants, MP3 or other digital music players, etc. In this example, electronic device 500 comprises a data processing system that includes a system bus 502 to couple the various components of the system. System bus 502 provides communications links among the various components of the electronic device 500 and can be implemented as a single bus, as a combination of busses, or in any other suitable manner.

An electronic assembly 510 is coupled to system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 700 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 516, one or more speakers 518, and a keyboard and/or controller 530, which can include a mouse, trackball, game controller, voice-recognition device, or any other device that permits a system user to input information into and receive information from the electronic device 500.

An underfill device and method have been shown. Advantages of devices and methods shown include dissipation of stresses at an interface between components such as a chip package and an adjacent circuit board. Another advantage includes faster manufacturing time and ease of manufacture using underfill devices and methods shown. An underfill assembly can be pre made with conductive structures included within the underfill assembly. Steps such as flowing epoxy and curing can be eliminated or performed concurrently with other manufacturing steps.

Although selected advantages are detailed above, the list is not intended to be exhaustive. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method, comprising:
    inserting a solid polymer underfill layer as a pre-formed sheet between a first component surface and a second directly adjacent component surface;
    adhering the polymer underfill layer to one or more regions to form a bond between the first component surface and the second directly adjacent component surface; and
    coupling one or more electrical connections through the polymer underfill layer between the first component surface and the second directly adjacent component surface after adhering the polymer underfill layer.

2. The method of claim 1, wherein inserting the solid polymer underfill layer between the first component surface and the second component surface includes picking and placing a polymer underfill layer between a chip package and a circuit board.

3. The method of claim 1, further comprising attaching the polymer underfill layer to the first component surface using an adhesive layer coupled to the polymer underfill layer.

4. The method of claim 3, further comprising attaching the polymer underfill layer to the second component surface using an adhesive layer coupled to the polymer underfill layer.

5. The method of claim 3, wherein attaching the polymer underfill layer to the first component surface using an adhesive layer includes peeling of a protective strip to expose the adhesive, then placing the adhesive against the first component surface.

6. The method of claim 3, wherein attaching the polymer underfill layer to the first component surface using an adhesive includes attaching using a thermally activated adhesive.

7. The method of claim 5, wherein coupling one or more electrical connections through the polymer underfill layer includes reflowing a solder connection.

\* \* \* \* \*